United States Patent
Kushner et al.

(10) Patent No.: US 10,097,199 B1
(45) Date of Patent: Oct. 9, 2018

(54) DIGITAL TO ANALOG CONVERTER WITH REMOTE CASCODE DEVICES

(71) Applicant: BAE SYSTEMS Information and Electronic Systems Integration Inc., Nashua, NH (US)

(72) Inventors: Lawrence J. Kushner, Andover, MA (US); Mark E. Stuenkel, Goffstown, NH (US); Steven E. Turner, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/893,895

(22) Filed: Feb. 12, 2018

(51) Int. Cl.
- H03M 1/66 (2006.01)
- H03M 1/74 (2006.01)
- G06F 9/22 (2006.01)
- H03F 3/45 (2006.01)

(52) U.S. Cl.
CPC ......... *H03M 1/742* (2013.01); *G06F 9/223* (2013.01); *H03F 3/45179* (2013.01)

(58) Field of Classification Search
CPC ..... H03M 1/742; H03F 3/45179; G06F 9/223
USPC ........................................... 341/144
See application file for complete search history.

(56) References Cited

U.S. PATENT DOCUMENTS

| | | | | |
|---|---|---|---|---|
| 9,118,346 B2 * | 8/2015 | Courcy | .................. | H03M 1/66 |
| 9,385,742 B1 * | 7/2016 | Cheng | .................. | H03M 1/742 |
| 9,584,152 B1 * | 2/2017 | Sheng | ..................... | H03M 1/66 |
| 9,929,741 B1 * | 3/2018 | Hsia | ........................ | H03M 1/66 |

OTHER PUBLICATIONS

Kushner, L. J. and M. T. Ainsworth, "Spurious Reduction for Direct Digital Synthesizers", Reprinted from Applied Microwave & Wireless, Summer 1996, 10 pages.

* cited by examiner

*Primary Examiner* — Brian Young
(74) *Attorney, Agent, or Firm* — Finch & Maloney PLLC; Scott J. Asmus (57) ABSTRACT

A digital to analog converter (DAC) circuit is disclosed which employs isolation providing cascode devices to reduce data dependent signal distortion. A DAC circuit configured according to an embodiment includes a current source associated with each bit of a digital word that is to be converted. Each current source is coupled to a current switch that is controlled by the associated bit. The DAC also includes a cascode device coupled to each of the current switches through a feed line. The DAC further includes a summing junction configured to generate an analog output signal corresponding to the digital word based on a sum of currents provided by the current sources, through the current switches and the feed lines. The cascode devices provide impedance matching and isolation between the feed lines and the summing junction to reduce signal reflections between the current switches and the summing junction to improve conversion performance.

13 Claims, 7 Drawing Sheets

FIG. 7 ns of the claimed
DIGITAL TO ANALOG CONVERTER WITH REMOTE CASCODE DEVICES

STATEMENT OF GOVERNMENT INTEREST

This invention was made with United States Government assistance under Contract No. W911QX-13-C-0050 awarded by the US Department of the Army. The United States Government has certain rights in this invention.

FIELD OF DISCLOSURE

The present disclosure relates to digital to analog converters (DACs), and more particularly, to DACs employing cascode devices to increase electrical isolation between switched current sources and a current summing node.

BACKGROUND

DACs typically operate by generating multiple components of a physical quantity (e.g., current, voltage, or electrical charge, etc.) and then summing those components together, in a manner that depends on the bits of a digital word that is to be converted to an analog output level. Errors can occur, however, in both the generation of the component parts and in the summation of those parts to generate the output signal. These errors create distortion in the output signal, limiting the DAC's performance (e.g., spurious free dynamic range, effective number of bits, etc.). Errors which are associated with the generation of the individual components are generally static and can typically be detected and corrected through on-chip tuning. Errors which are generated during the summation of the components, however, are generally dynamic (e.g., they depend on the digital word being converted) and are therefore more difficult to detect and correct.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Although the following Detailed Description will proceed with reference being made to illustrative embodiments, many alternatives, modifications, and variations thereof will be apparent to those skilled in the art.

DETAILED DESCRIPTION

Digital to analog converters (DACs) are disclosed which include cascode devices that are deployed remotely from the DAC's switched current sources and relatively closer to the analog output current summing junction, to provide increased isolation between current sources and reduced signal reflection between the current sources and the summing junction, as will be explained in greater detail below. The use of cascode devices employed in this manner results in improved DAC performance, including reduced dynamic (data dependent) distortion, particularly at higher frequencies.

The disclosed DACs can be employed, for example, in a communication platform or computing system, although any number of other applications having a need for conversion between the digital and analog domains will be apparent. In accordance with an embodiment, a DAC circuit includes a number of current sources, each source associated with a bit of a digital word that is to be converted. Each current source is coupled to a current switch that is controlled by the associated bit of the digital word. The DAC also includes a cascode device that is coupled through a feed line to each of the current switches. The DAC further includes a summing junction configured to generate an analog output signal, corresponding to the digital word, based on a sum of the currents provided by the current sources, through the current switches and the feed lines. The cascode devices provide impedance matching and isolation between the feed lines and the summing junction to reduce signal reflections between the current switches and the summing junction which reduces distortion and improves conversion performance.

As will be appreciated in light of this disclosure, the DACs described herein may allow for improved performance compared to existing DACs which directly couple the switched current sources to the summing junction through a network of feed lines of varying lengths with impedance mismatches that generate errors in the current summation. The disclosed DACs can be implemented on a broad range of platforms including radios, data communication devices, smart phones, personal computers, laptop computers, tablets, and so forth.

Figure 1A:
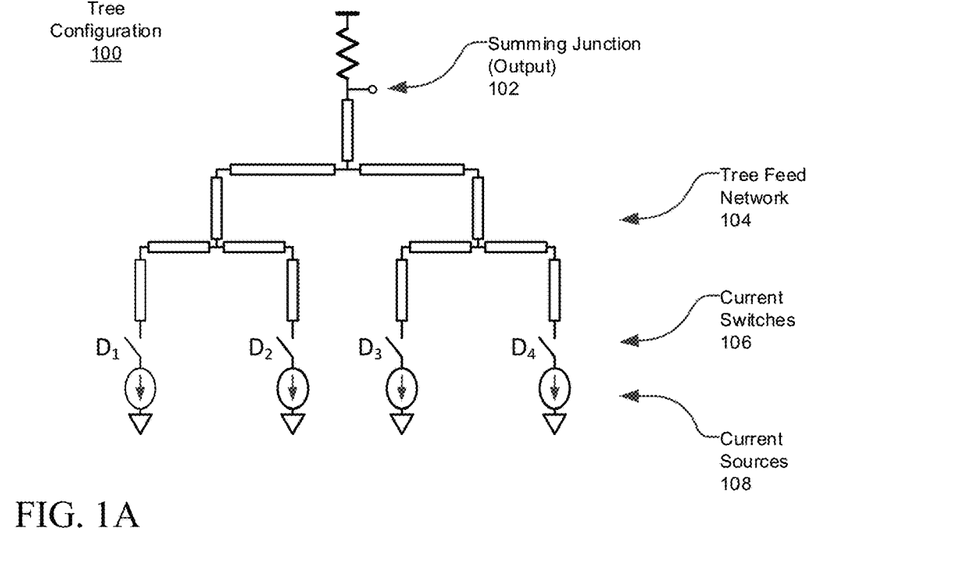
FIGS. 1A and 1B illustrate example topologies of DAC circuits including a tree configuration and a star configuration.
Figure 1B:
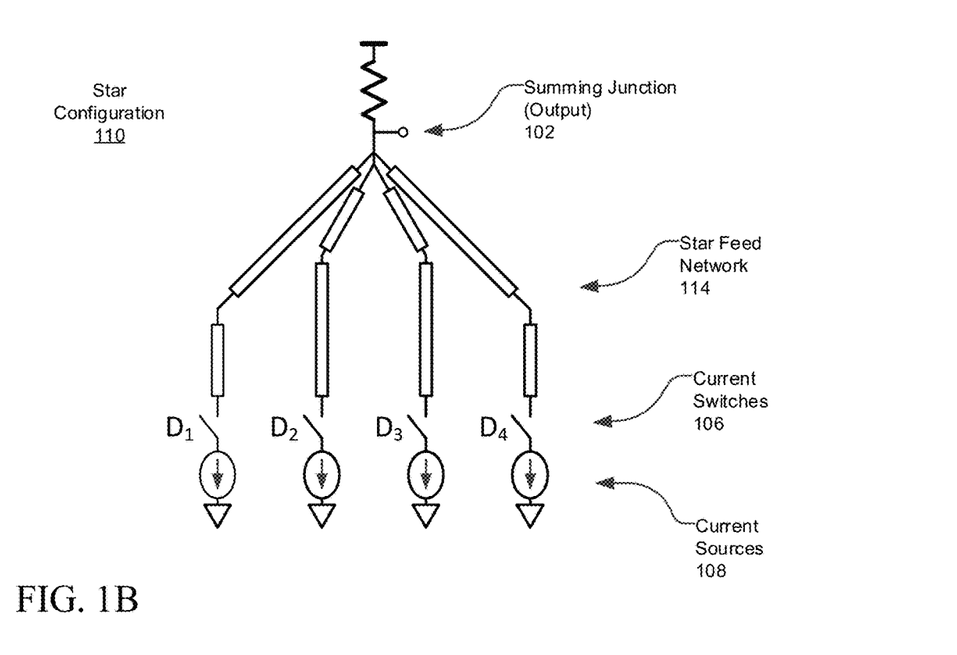

FIG. 1A illustrates an example topology of a DAC circuit in a tree configuration 100, and FIG. 1B illustrates an example topology of a DAC circuit in a star configuration 110. In both examples, there are N current sources 108, each of which is configured to provide a selected level of current associated with a bit of the digital word to be converted. So, for example, to convert a 4-bit digital word (D1, D2, D3, D4, where D1 is the least significant bit), current source 1 provides a current level I, current source 2 provides a current level 2*I, current source 3 provides a current level 4*I, and current source 4 provides a current level 8*I. Each of the current sources are switched into a feed network (either tree network 104 or star network 114) through a current switch 106 which is controlled by the value of the associated digital word bit D1, D2, D3, or D4. Continuing with this example, a digital word of '1100' (D4=D3=1, and D2=D1=0) causes switches D4 and D3 to be closed and switches D2 and D1 to be open, allowing a current of 8*I and 4*I to flow through the feed network to a summing junction 102. The summed current of 12*I represents the analog value of the digital word '1100' and is provided as an analog output signal.

DAC circuits employing these feed network topologies (tree networks, star networks, and other similar, known configurations) suffer from a number of problems. One such problem is that these topologies generally provide insufficient isolation between the current sources 108. As such, the load on each of the current sources is a function of the number of current sources that are switched on (e.g. connected to the network) at any given time, resulting in data-dependent load modulation which generates signal distortion that is difficult to correct. Another problem is that signal reflections can occur due to mismatched impedances at various points in the feed network, which can cause further distortion and degrade performance, particularly at higher frequencies where the electrical length of the feed lines increases.

Figure 2:
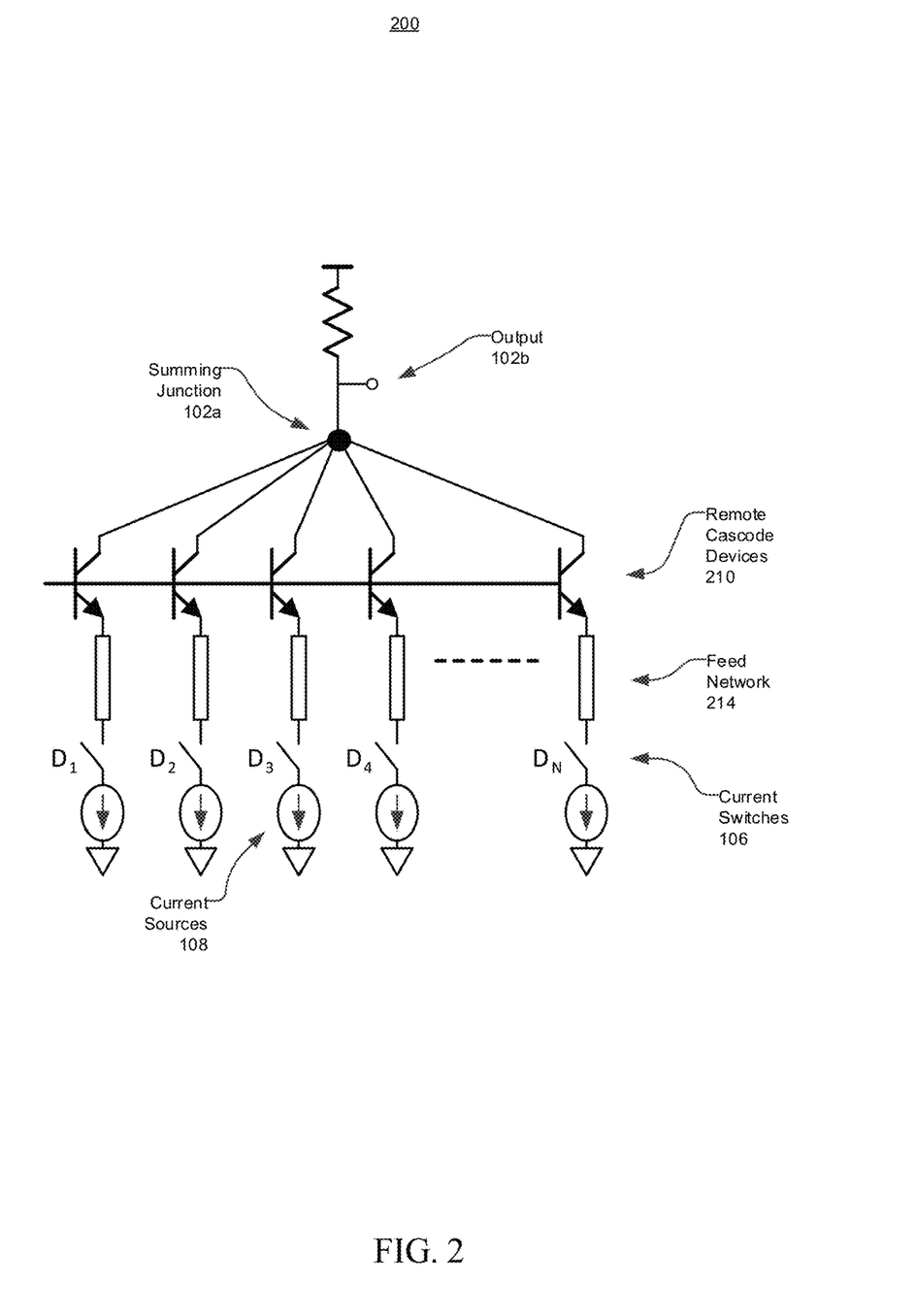
FIG. 2 is a circuit diagram of a DAC circuit employing remote cascode devices, configured in accordance with certain of the embodiments disclosed herein.

FIG. 2 is a circuit diagram 200 of a DAC circuit employing remote cascode devices, configured in accordance with certain of the embodiments disclosed herein. The DAC is shown to include current sources 108, current switches 106, a feed network 214, remote cascode devices 210, a summing junction 102a and an output port 102b. The term "remote" is used to indicate that the cascode devices are located at a position that is relatively remote from the current switches, compared to the distance from the cascode to the summing junction, thus providing increased isolation between current sources and reduced signal reflection between the current sources and the summing junction.

The current sources 108 are configured to provide selected levels of current to the DAC circuit for each bit of the digital word to be converted. An N-bit DAC may therefore include N current sources configured to provide current levels at power-of-2 scale factors for each bit, as described above.

The current switches 106 are configured to switch the current sources 108 into or out of the feed network 214 and are controllable by the bits of the digital word to be converted. For example, in some embodiments a '1' at bit position $D_i$ may cause current switch i to switch current source i into feed line i of the feed network, while a '0' bit would cause that current source to be switched out. In some embodiments, the current switches may be implemented as transistors (e.g., bipolar junction transistors or field effect transistors).

The feed network 214 is shown to include a number of feed lines (e.g., conductive paths, transmission lines, etc.), typically equal to the number of current sources, to couple each of the switched current sources to an associated remote cascode device 210. This is a variation of the star topology described above, with the addition of a common-base or common-gate configured cascode device 210. In the embodiment illustrated in this example, the cascode devices are implemented as BJTs sharing a common base. The remote cascode devices 210 are configured to provide electrical isolation between the summing junction, on the collector port of the BJT, and each of the feed lines (and by extension to the current switches and current sources), on the emitter port of the BJT. Since each feed line has a single termination at the cascode device, undesirable signal reflections are reduced or eliminated.

It will be appreciated that the term "cascode" typically refers to a 2-stage amplifier that includes a common-emitter (or common-source) stage feeding into a common-base (or common-gate) stage. The common-base (or common-gate) stage is referred to as the "cascode device" (or the "cascoded device"), as used herein. In the disclosed embodiments, the current switch transistors serve as the common-emitter (or common-source) component of the cascode.

The summing junction 102a is configured to generate an analog output signal corresponding to the digital word, for example at the output port 102b, based on a sum of the currents provided by the current sources (through the current switches, feed lines, and cascode devices).

The feed lines and the cascode devices can be optimized to minimize reflections, reduce distortion, and increase the DAC's output power. For example, in some embodiments, the dimensions of the cascode device are chosen such that the resulting cascode device transconductance (also referred to as $g_m$) causes the cascode device input impedance to match the characteristic impedance of the feed line to which the cascode device is coupled. In some embodiments, the operation of the cascode device includes application of a bias current selected to cause the input impedance of the cascode device to match the characteristic impedance of the feed line coupled to that device.

In some embodiments, a resistor is coupled in series between the cascode device and the feed line coupled to that cascode device. The resistance value is selected or tuned to match the characteristic impedance of the feed line to the input impedance of the cascode device. In some embodiments, the dimensions of the feed line are selected or tuned to match the characteristic impedance of the feed line to the input impedance of the cascode device coupled to that feed line.

In some embodiments, the BJTs of the cascode device may be configured with a high Early voltage, such as, for example, Hetero Junction Bipolar Transistors (HBTs) fabricated from silicon germanium or indium phosphide. A high Early voltage is associated with a relatively flat I-V (current-voltage) curve and higher output impedance. The higher output impedance enables the cascode device to provide higher levels of isolation between the summing junction and the feed lines, to reduce data-dependent modulation distortion at the output. Another way to view the cascode device is as an impedance transformer, with a low input impedance that acts as a good current sink, and a high output impedance that acts as a good current source.

Figure 3:
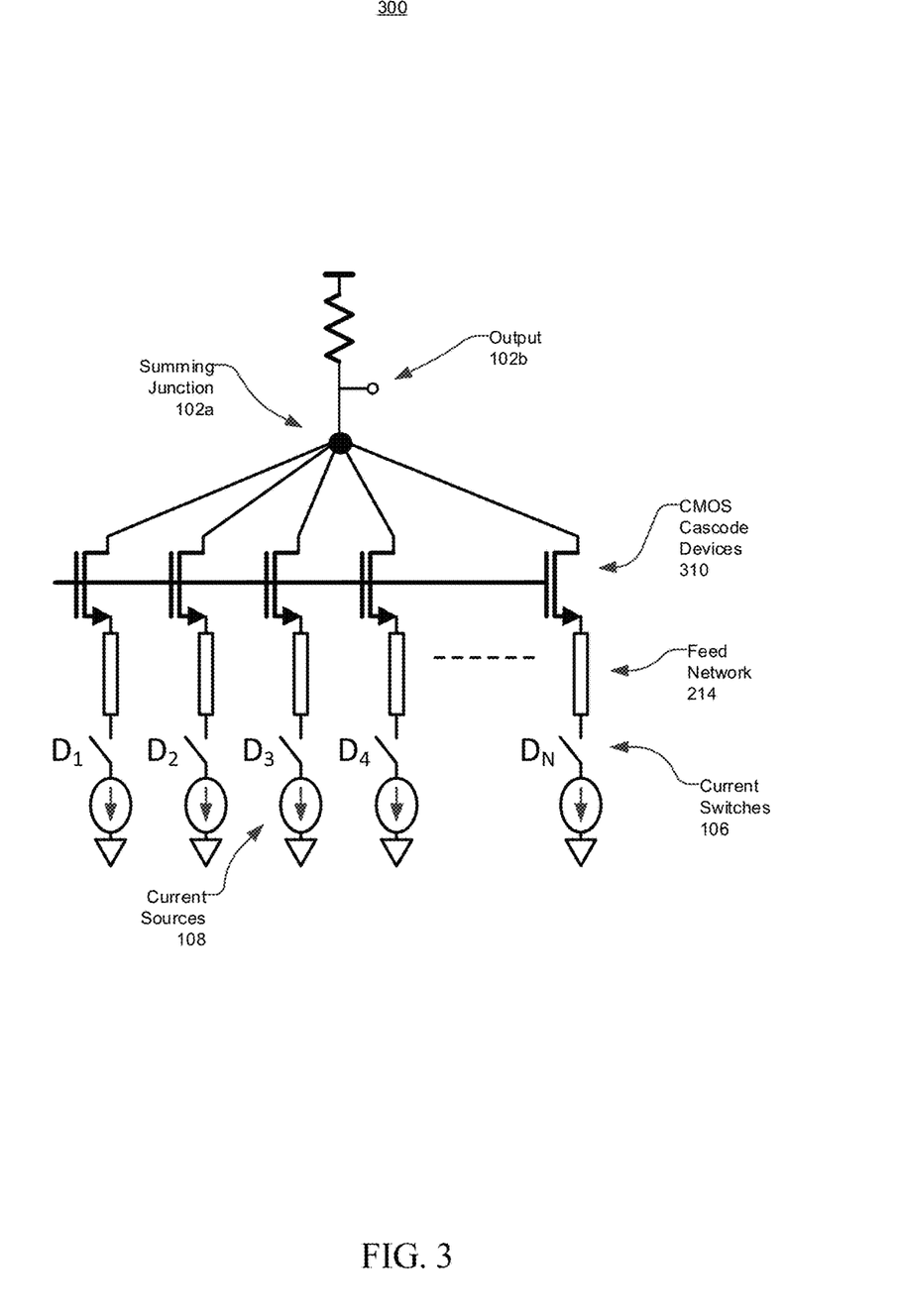
FIG. 3 is a circuit diagram of a DAC circuit employing complementary metal oxide semiconductor (CMOS) field effect transistor (FET) remote cascode devices, configured in accordance with certain of the embodiments disclosed herein.

FIG. 3 is a circuit diagram 300 of a DAC circuit employing CMOS FET remote cascode devices, configured in accordance with certain of the embodiments disclosed herein. In this alternative embodiment, the CMOS FET cascode devices 310 are employed in a common gate configuration as shown, otherwise the DAC operates in the same manner as described above in connection with the embodiment of FIG. 2.

Figure 4:
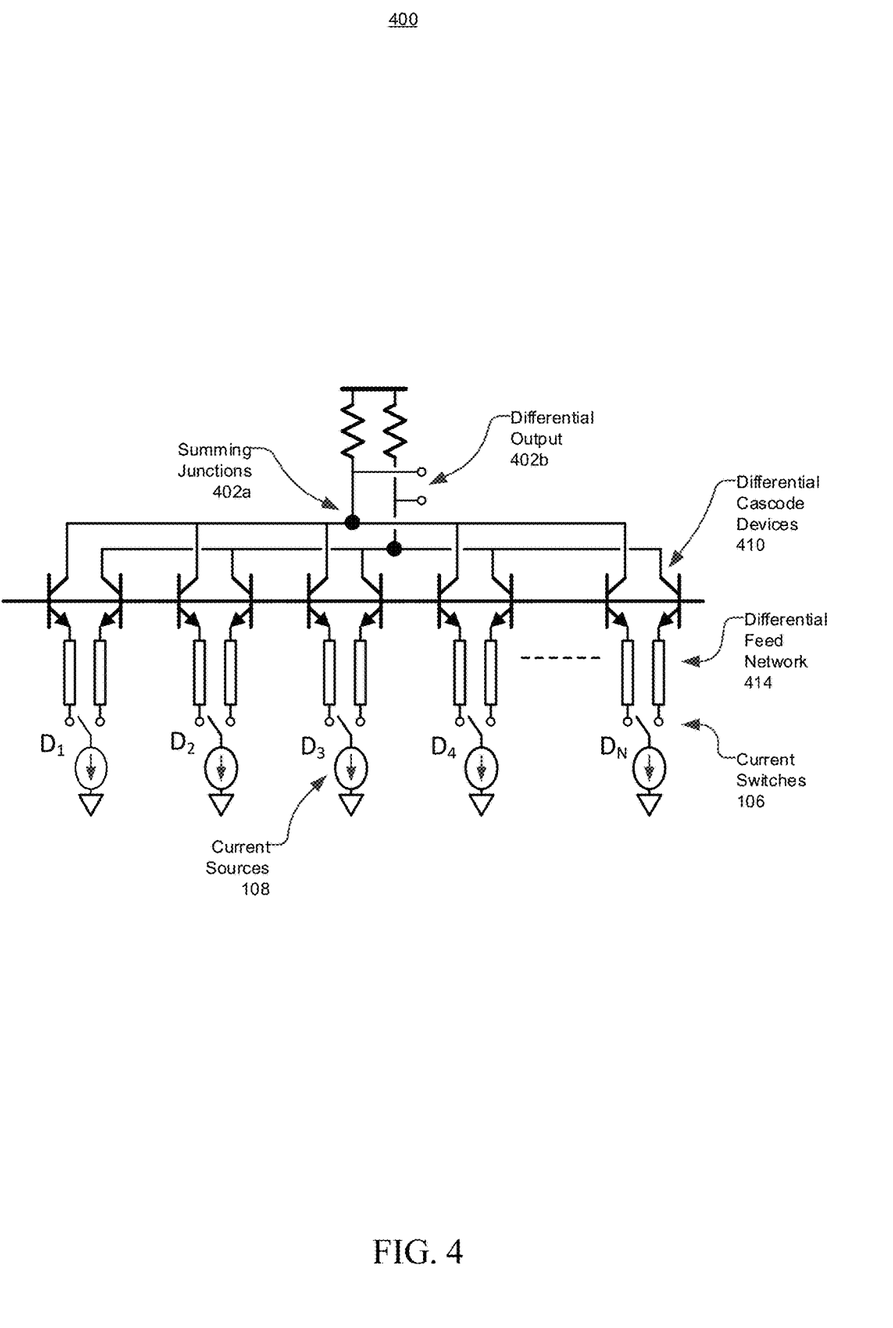
FIG. 4 is a circuit diagram of a DAC circuit employing differential remote cascode devices, configured in accordance with certain of the embodiments disclosed herein.

FIG. 4 is a circuit diagram 400 of a DAC circuit employing differential remote cascode devices, configured in accordance with certain of the embodiments disclosed herein. The DAC circuit shown in this alternative embodiment is similar to that shown previously in FIG. 2 with the exception that the cascode devices 410 are configured as differential pairs of BJTs coupled on the emitter port to a differential feed network 414, and on the collector port to a differential summing junction 402a to provide a differential output 402b. Additionally, each current switch 106 switches between a pair of feed lines of the differential feed network 414.

Figure 5:
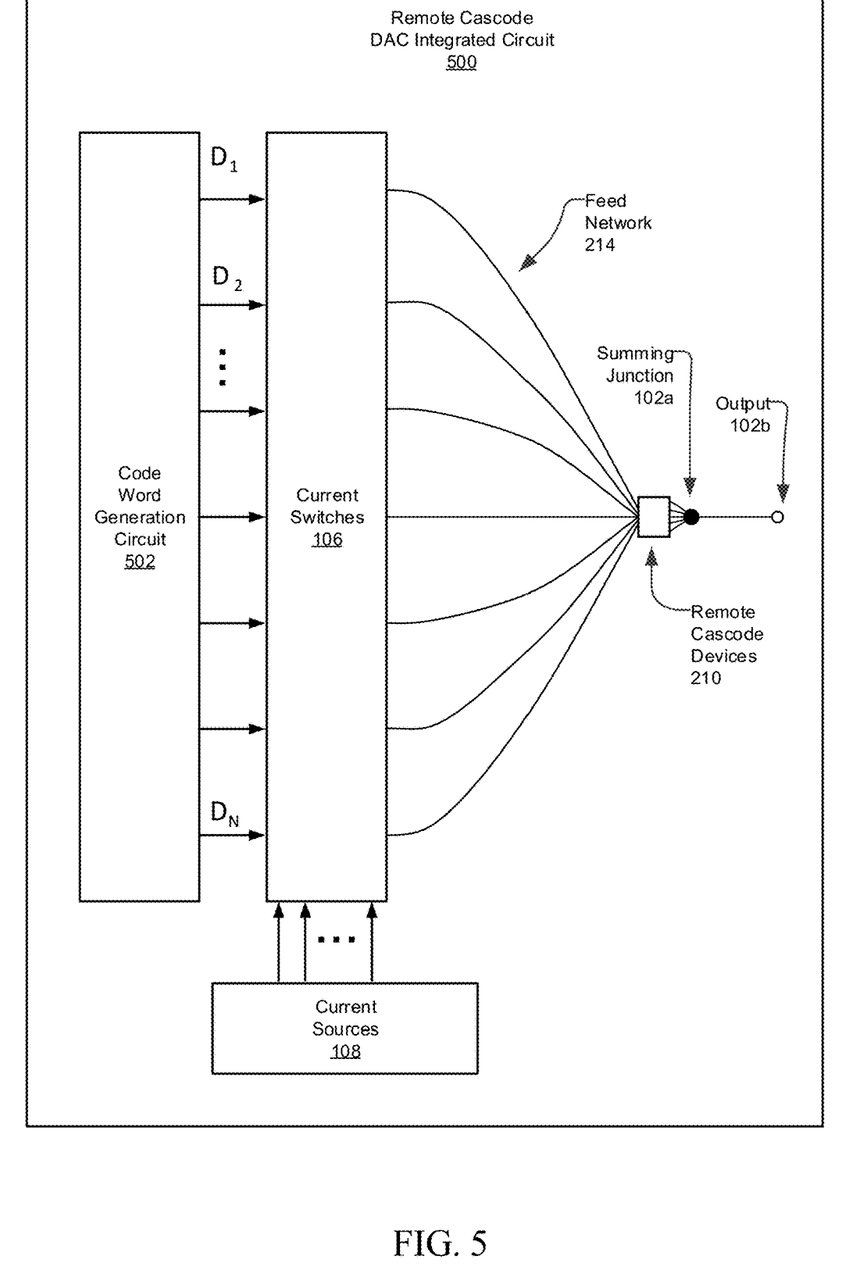
FIG. 5 illustrates a remote cascode device DAC integrated circuit, configured in accordance with certain of the embodiments disclosed herein.

FIG. 5 illustrates a remote cascode device DAC integrated circuit 500, configured in accordance with certain of the embodiments disclosed herein. The IC is shown to include a code word generation circuit 502, current switches 106, current sources 108, a distributed feed network 214, the remote cascode devices 210, summing junction 102a, and output port 102b. Code word generation circuit 502 is configured to provide the digital code word (e.g., bits D1-DN) which is to be converted to an analog output signal. These code word bits control the operations of the associated current switches 106 to enable or disable current from current sources 108 to flow through the feed lines of feed network 214, as previously described. Although the layout of components on the IC is not necessarily drawn to scale, it can be seen that the remote cascode devices 210 are physically clustered relatively close together to create an electrically small, or "lumped" summing junction 102a. Said differently, the distance between the current switches and the cascode devices (and thus the length of the feed lines) is significantly greater than the distance between the cascode devices and the summing junction, as well as the distances between each of the cascode devices from any other cascode device.

In some embodiments, the disclosed cascode devices provide an additional advantage in that they isolate the switched current sources from load voltage variations, thus providing the current sources with a nearly constant load voltage. This allows the switched current sources to be configured with a lower output impedance while maintaining effective operation, as the near-constant load voltage results in near-constant output current. This enables the use of lower output impedance CMOS FETs as the current sources to drive higher output impedance BJT cascode devices, resulting in a more compact design (e.g., reduced footprint) with reduced parasitic effects and reduced power consumption.

Methodology

Figure 6:
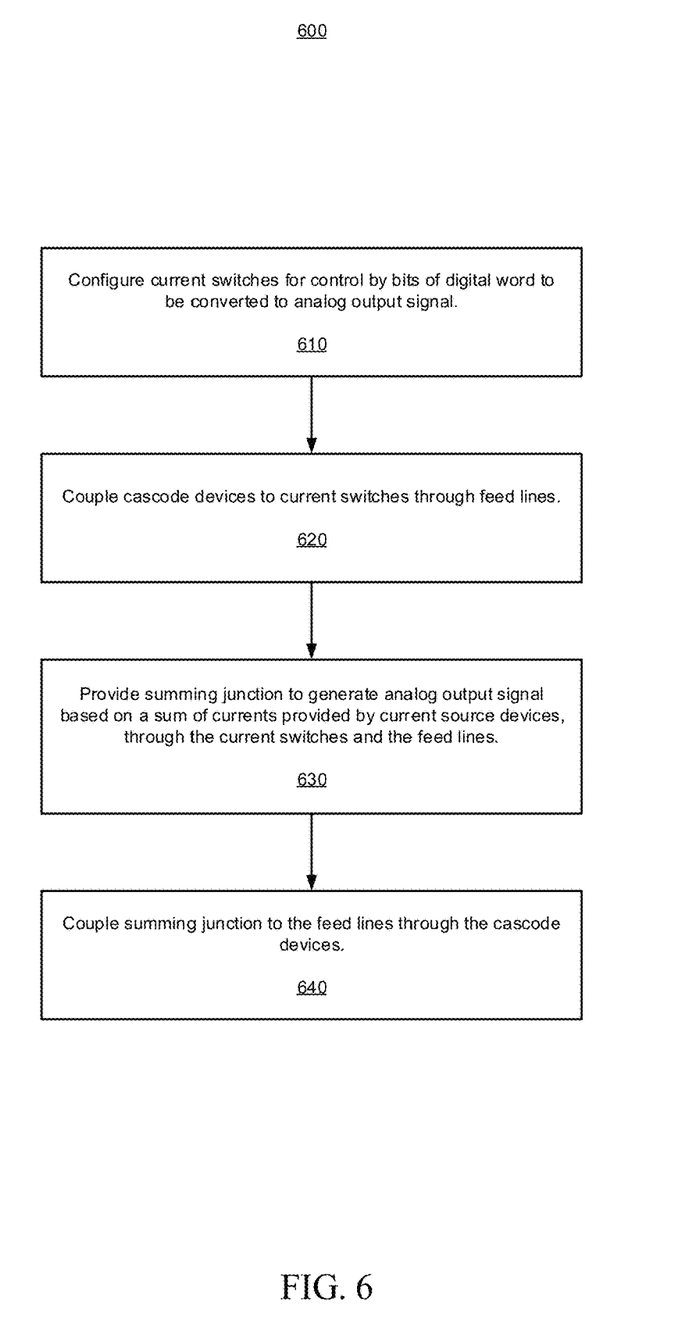
FIG. 6 is a flowchart illustrating a methodology for fabrication of a remote cascode device DAC, in accordance with certain of the embodiments disclosed herein.

FIG. 6 is a flowchart illustrating an example method 600 for fabrication of a remote cascode device digital to analog converter (DAC), in accordance with an embodiment of the present disclosure. As can be seen, example method 600 includes a number of phases and sub-processes, the sequence of which may vary from one embodiment to another. However, when considered in the aggregate, these phases and sub-processes form a fabrication process for a remote cascode device DAC in accordance with certain of the embodiments disclosed herein. These embodiments can be implemented, for example using the system architecture illustrated in FIGS. 2-5, as described above. However other system architectures can be used in other embodiments, as will be apparent in light of this disclosure. To this end, the correlation of the various functions shown in FIG. 6 to the specific components illustrated in FIGS. 2-5 is not intended to imply any structural and/or use limitations. Rather other embodiments may include, for example, varying degrees of integration wherein multiple functionalities are effectively performed by one system. For example, in an alternative embodiment a single module can be used to perform all of the functions of method 600. Thus, other embodiments may have fewer or more modules and/or sub-modules depending on the granularity of implementation. Numerous variations and alternative configurations will be apparent in light of this disclosure.

As illustrated in FIG. 6, in one embodiment DAC fabrication method 600 commences by configuring, at operation 610, a plurality of current switches to be controlled by a selected bit of the digital word to be converted. Next, at operation 620, each of a plurality of cascode devices is coupled to one of the current switches through a feed line.

At operation 630, a summing junction is provided to generate an analog output signal corresponding to the digital word. The output signal is based on a sum of currents provided by current source devices, through the current switches and the feed lines. In some embodiments, the current source devices are CMOS FETs, and the cascode devices are BJTs fabricated from SiGe or InP.

At operation 640, the summing junction is coupled to the feed lines through the cascode devices. The cascode devices are configured to provide isolation between the feed lines and the summing junction.

Of course, in some embodiments, additional operations may be performed, as previously described in connection with the system. These additional operations may include, for example, configuring the input impedance of the cascode device to match the characteristic impedance of the feed line coupled to the cascode device. The input impedance is based on the transconductance of the cascode device which is associated with the dimensions of the device.

Additionally, in some embodiments, a series resistor is coupled between the cascode device and the feed line coupled to that cascode device. The value of the resistor is selected to match the characteristic impedance of the feed line to the input impedance of the cascode device. In some further embodiments, the dimensions of the feed line or selected to match the characteristic impedance of the feed line to the input impedance of the cascode device coupled to that the line.

Example Platform

Figure 7:
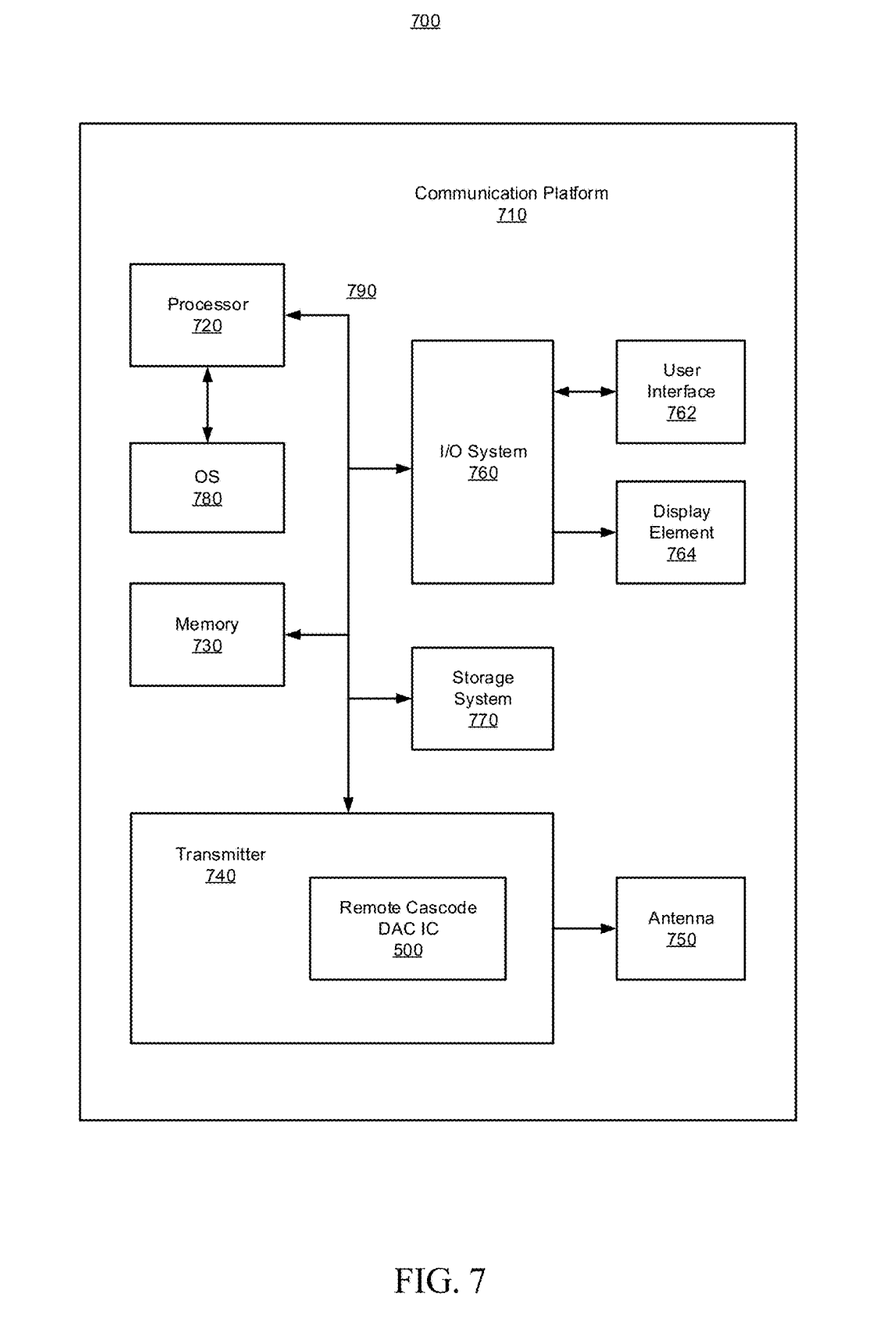
FIG. 7 is a block diagram schematically illustrating a communication platform employing the remote cascode device DAC, in accordance with certain of the embodiments disclosed herein.

FIG. 7 is a block diagram 700 schematically illustrating a communication platform 710 including a transmitter 740 which employs the remote cascode device DAC integrated circuit 500, in accordance with certain of the embodiments disclosed herein. In some embodiments, communications platform 710 may be hosted on, or otherwise be incorporated into, a radio, data communication device, personal computer, workstation, laptop computer, tablet, portable computer, and so forth. Any combination of different devices may be used in certain embodiments.

In some embodiments, platform 710 may comprise any combination of a processor 720, a memory 730, a transmitter (or transceiver) 740, an input/output (I/O) system 760, a user interface 762, a display element 764, and a storage system 770. As can be further seen, a bus and/or interconnect 790 is also provided to allow for communication between the various components listed above and/or other components not shown. Other componentry and functionality not reflected in the block diagram of FIG. 7 will be apparent in light of this disclosure, and it will be appreciated that other embodiments are not limited to any particular hardware configuration.

Processor 720 can be any suitable processor, and may include one or more coprocessors or controllers, such as an audio processor, a graphics processing unit, or hardware accelerator, to assist in control and processing operations associated with platform 710. In some embodiments, the processor 720 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 720 may be implemented as a complex instruction set computer (CISC) or a reduced instruction set computer (RISC) processor.

Memory 730 can be implemented using any suitable type of digital storage including, for example, flash memory and/or random access memory (RAM). In some embodiments, the memory 730 may include various layers of memory hierarchy and/or memory caches as are known to those of skill in the art. Memory 730 may be implemented as a volatile memory device such as, but not limited to, a RAM, dynamic RAM (DRAM), or static RAM (SRAM) device. Storage system 770 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 770 may comprise technology to increase the storage performance enhanced protection for valuable digital media when multiple hard drives are included.

Processor 720 may be configured to execute an Operating System (OS) 780 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 710, and therefore may also be implemented using any suitable existing or subsequently-developed platform.

I/O system 760 may be configured to interface between various I/O devices and other components of platform 710. I/O devices may include, but not be limited to, user interface 762 and display element 764. User interface 762 may include other devices (not shown) such as a touchpad, keyboard, mouse, microphone and speaker, etc. I/O system 760 may include a graphics subsystem configured to perform processing of images for rendering on the display element 764. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 720 or any chipset of platform 710.

It will be appreciated that in some embodiments, the various components of platform 710 may be combined or integrated in a system-on-a-chip (SoC) architecture. In some embodiments, the components may be hardware components, firmware components, software components or any suitable combination of hardware, firmware or software.

Transmitter 740 is configured to provide signal transmission capabilities for the platform 710 and to employ remote cascode device DAC IC 500 to convert digital signals to analog signals for those transmissions. In some embodiments, transmitter 740 may include RF components such as amplifiers, filters, mixers, and the like, to transform an analog baseband signal into an RF signal and vice versa. Remote cascode device DAC IC 500 is configured to provide improved digital to analog conversion with reduced data dependent signal distortion, as previously described. Remote cascode device DAC IC 500 may include any or all of the components and features illustrated in FIGS. 2-5, as described above. These components can be implemented or otherwise used in conjunction with a variety of suitable software and/or hardware that is coupled to or that otherwise forms a part of platform 710.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. Other componentry and functionality not reflected in the illustrations will be apparent in light of this disclosure, and it will be appreciated that other embodiments are not limited to any particular hardware or software configuration. Thus, in other embodiments platform 710 may comprise additional, fewer, or alternative subcomponents as compared to those included in the example embodiment of FIG. 7.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). In some embodiments, the hardware may be modeled or developed using hardware description languages such as, for example Verilog or VHDL. Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a digital to analog converter (DAC) circuit. The DAC circuit includes: a plurality of current switches, each of the current switches controlled by a selected bit of a digital word; a plurality of cascode devices, each cascode device coupled to one of the current switches through a feed line; and a summing junction to generate an analog output signal corresponding to the digital word, based on a sum of currents provided by current source devices, through the current switches and the feed lines, wherein the cascode devices provide isolation between the feed lines and the summing junction.

In some cases, an input impedance of the cascode device matches a characteristic impedance of the feed line coupled to the cascode device, the input impedance based on a transconductance of the cascode device, the transconductance associated with dimensions of the cascode device. In some cases, an input impedance of the cascode device matches a characteristic impedance of the feed line coupled to the cascode device, based on application of a bias current to the cascode device. In some cases, the DAC circuit further includes a resistor coupled in series between the cascode device and the feed line coupled to the cascode device, the resistor selected to match a characteristic impedance of the feed line to an input impedance of the cascode device. In some cases, dimensions of the feed line are selected to match a characteristic impedance of the feed line to an input impedance of the cascode device coupled to the feed line. In some cases, the feed lines, the cascode devices, and the summing junction are configured in a differential topology. In some cases, the current source devices are complementary metal oxide semiconductor field effect transistors. In some cases, the DAC circuit further includes a code word generation circuit to generate the bits of the digital word for control of the current switches. In some cases, the current switches, feed lines, cascode devices, and summing junction are disposed on an integrated circuit, and the distance between the current switches and the cascode devices is greater than the distance between the cascode devices and the summing junction. In some cases, the distance between the current switches and the cascode devices is greater than the distance between any one of the cascode devices and any other of the cascode devices.

Another example embodiment of the present disclosure provides a communications system. The communication system includes a digital to analog converter (DAC) circuit further including: a plurality of current switches, each of the current switches controlled by a selected bit of a digital word, a plurality of cascode devices, each cascode device coupled to one of the current switches through a feed line, and a summing junction to generate an analog output signal corresponding to the digital word, based on a sum of currents provided by current source devices, through the current switches and the feed lines, wherein the cascode devices provide isolation between the feed lines and the summing junction. The communication system further includes a code word generation circuit to generate the bits of the digital word for control of the current switches and a transmitter circuit to convert the analog output signal to a selected radio frequency for transmission through an antenna.

In some cases, an input impedance of the cascode device matches a characteristic impedance of the feed line coupled to the cascode device, the input impedance based on a transconductance of the cascode device, the transconductance associated with dimensions of the cascode device. In some cases, an input impedance of the cascode device matches a characteristic impedance of the feed line coupled to the cascode device, based on application of a bias current to the cascode device. In some cases, the DAC circuit further includes a resistor coupled in series between the cascode device and the feed line coupled to the cascode device, the resistor selected to match a characteristic impedance of the feed line to an input impedance of the cascode device. In some cases, dimensions of the feed line are selected to match a characteristic impedance of the feed line to an input impedance of the cascode device coupled to the feed line.

Another example embodiment of the present disclosure provides a method for fabricating a digital to analog converter. The method includes: configuring a plurality of current switches to be controlled by a selected bit of a digital word; coupling each of a plurality of cascode devices to one of the current switches through a feed line; providing a summing junction to generate an analog output signal corresponding to the digital word, based on a sum of currents provided by current source devices, through the current switches and the feed lines; and coupling the summing junction to the feed lines through the cascode devices, wherein the cascode devices provide isolation between the feed lines and the summing junction.

In some cases, the method further includes configuring an input impedance of the cascode device to match a characteristic impedance of the feed line coupled to the cascode device, the input impedance based on a transconductance of the cascode device, the transconductance associated with dimensions of the cascode device. In some cases, the method further includes configuring an input impedance of the cascode device to match a characteristic impedance of the feed line coupled to the cascode device, based on application of a bias current to the cascode device. In some cases, the method further includes coupling a resistor in series between the cascode device and the feed line coupled to the cascode device, the resistor selected to match a characteristic impedance of the feed line to an input impedance of the cascode device. In some cases, the method further includes selecting dimensions of the feed line to match a characteristic impedance of the feed line to an input impedance of the cascode device coupled to the feed line.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A digital to analog converter (DAC) circuit comprising:
   a plurality of current switches, each of the current switches controlled by a selected bit of a digital word;
   a plurality of cascode devices, each cascode device coupled to one of the current switches through a feed line;
   a summing junction to generate an analog output signal corresponding to the digital word, based on a sum of currents provided by current source devices, through the current switches and the feed lines, wherein the cascode devices provide isolation between the feed lines and the summing junction; and
   a resistor coupled in series between the cascode device and the feed line coupled to the cascode device, the resistor selected to match a characteristic impedance of the feed line to an input impedance of the cascode device.

2. The DAC circuit of claim 1, wherein the feed lines, the cascode devices, and the summing junction are configured in a differential topology.

3. The DAC circuit of claim 1, wherein the current source devices are complementary metal oxide semiconductor field effect transistors.

4. The DAC circuit of claim 1, further comprising a code word generation circuit to generate the bits of the digital word for control of the current switches.

5. The DAC circuit of claim 1, wherein the current switches, feed lines, cascode devices, and summing junction are disposed on an integrated circuit, and the distance between the current switches and the cascode devices is greater than the distance between the cascode devices and the summing junction.

6. The DAC circuit of claim 1, wherein the distance between the current switches and the cascode devices is greater than the distance between any one of the cascode devices and any other of the cascode devices.

7. A communications system comprising:
a digital to analog converter (DAC) circuit including
- a plurality of current switches, each of the current switches controlled by a selected bit of a digital word,
- a plurality of cascode devices, each cascode device coupled to one of the current switches through a feed line, and
- a summing junction to generate an analog output signal corresponding to the digital word, based on a sum of currents provided by current source devices, through the current switches and the feed lines, wherein the cascode devices provide isolation between the feed lines and the summing junction;

a code word generation circuit to generate the bits of the digital word for control of the current switches; and a transmitter circuit to convert the analog output signal to a selected radio frequency for transmission through an antenna.

8. The communications system of claim 7, wherein an input impedance of the cascode device matches a characteristic impedance of the feed line coupled to the cascode device, the input impedance based on a transconductance of the cascode device, the transconductance associated with dimensions of the cascode device.

9. The communications system of claim 7, wherein an input impedance of the cascode device matches a characteristic impedance of the feed line coupled to the cascode device, based on application of a bias current to the cascode device.

10. The communications system of claim 7, wherein the DAC circuit further comprises a resistor coupled in series between the cascode device and the feed line coupled to the cascode device, the resistor selected to match a characteristic impedance of the feed line to an input impedance of the cascode device.

11. The communications system of claim 7, wherein dimensions of the feed line are selected to match a characteristic impedance of the feed line to an input impedance of the cascode device coupled to the feed line.

12. A method for fabricating a digital to analog converter, the method comprising:
- configuring a plurality of current switches to be controlled by a selected bit of a digital word;
- coupling each of a plurality of cascode devices to one of the current switches through a feed line;
- providing a summing junction to generate an analog output signal corresponding to the digital word, based on a sum of currents provided by current source devices, through the current switches and the feed lines;
- coupling the summing junction to the feed lines through the cascode devices, wherein the cascode devices provide isolation between the feed lines and the summing junction; and
- configuring an input impedance of the cascode device to match a characteristic impedance of the feed line coupled to the cascode device, the input impedance based on a transconductance of the cascode device, the transconductance associated with dimensions of the cascode device.

13. The method of claim 12, further comprising coupling a resistor in series between the cascode device and the feed line coupled to the cascode device, the resistor selected to match a characteristic impedance of the feed line to an input impedance of the cascode device.

* * * * *